US012198757B2

(12) United States Patent
Lin et al.

(10) Patent No.: US 12,198,757 B2
(45) Date of Patent: Jan. 14, 2025

(54) MEMORY DEVICE AND METHOD FOR OPERATING THE SAME

(71) Applicant: MACRONIX INTERNATIONAL CO., LTD., Hsinchu (TW)

(72) Inventors: Yu-Yu Lin, New Taipei (TW); Feng-Min Lee, Hsinchu (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 264 days.

(21) Appl. No.: 17/842,989

(22) Filed: Jun. 17, 2022

(65) Prior Publication Data

US 2023/0253039 A1 Aug. 10, 2023

Related U.S. Application Data

(60) Provisional application No. 63/307,171, filed on Feb. 7, 2022.

(51) Int. Cl.
*G11C 11/00* (2006.01)
*G11C 13/00* (2006.01)
(Continued)

(52) U.S. Cl.
CPC ...... *G11C 13/0033* (2013.01); *G11C 13/0011* (2013.01); *G11C 13/004* (2013.01);
(Continued)

(58) Field of Classification Search
CPC ............ G11C 13/0033; G11C 13/0011; G11C 13/004; G11C 13/0069
See application file for complete search history.

(56) References Cited

U.S. PATENT DOCUMENTS 7,558,149 B2 7/2009 Chen
7,679,980 B2 * 3/2010 Happ ................. G11C 16/3431
365/163

(Continued)

FOREIGN PATENT DOCUMENTS

EP 3050062 B1 8/2016

OTHER PUBLICATIONS

Lin, Y.Y., et al.; "Atomic Storage Random Access Memory for DRAM-like Applications;" pp. 1-2.
(Continued)

*Primary Examiner* — Pho M Luu
(74) *Attorney, Agent, or Firm* — McClure, Qualey & Rodack, LLP

(57) ABSTRACT

A memory device and a method for operating the same are provided. The memory device includes a plurality of resistive memory cells and a control circuitry electrically connected to the plurality of resistive memory cells. The control circuitry provides operation modes to operate the plurality of resistive memory cells. The operation modes include a first program operation and a refresh operation. The first program operation includes applying a first program bias voltage to a selected resistive memory cell of the plurality of resistive memory cells to establish a low-resistance state in the selected resistive memory cell. The first program operation establishes a first threshold voltage in the memory device. The refresh operation includes applying a refresh bias voltage to the selected resistive memory cell to refresh the selected resistive memory cell. An absolute value of the refresh bias voltage is greater than the first threshold voltage.

20 Claims, 3 Drawing Sheets

(51) Int. Cl.
*H10N 70/00* (2023.01)
*H10N 70/20* (2023.01)

(52) U.S. Cl.
CPC ....... *G11C 13/0069* (2013.01); *H10N 70/245* (2023.02); *H10N 70/8416* (2023.02)

(56) References Cited

U.S. PATENT DOCUMENTS

| | | |
|---|---|---|
| 9,159,377 B2 | 10/2015 | Park |
| 2013/0242640 A1* | 9/2013 | Haukness .......... G11C 13/0097 365/148 |
| 2014/0153315 A1 | 6/2014 | Kwon |
| 2018/0130526 A1* | 5/2018 | Hong ................. G11C 13/0069 |

OTHER PUBLICATIONS

Sills, S., et al.; "A Copper ReRAM Cell for Storage Class Memory Applications;" 2014 Symposium on VLSI Technology Digest of Technical Papers; 2014; pp. 1-2.

Wang, W., et al.; "Volatile Resistive Switching Memory Based on Ag Ion Drift/Diffusion Part I: Numerical Modeling;" IEEE Transactions on Electron Devices; vol. 66; No. 9; Sep. 2019; pp. 3795-3801.

* cited by examiner

MEMORY DEVICE AND METHOD FOR OPERATING THE SAME

This application claims the benefit of U.S. provisional application Ser. No. 63/307,171, filed Feb. 7, 2022, the subject matter of which is incorporated herein by reference.

BACKGROUND

Technical Field

The disclosure relates to a memory device and a method for operating the same, and more particularly to a programmable resistive memory device and a method for manufacturing the same.

DESCRIPTION OF THE RELATED ART

Resistive memory is emerging technology for non-volatile memory devices. Resistive memory device works by changing the resistance across a memory material, and the resistance can be read and written to indicate stored data. One problem with resistive memory device involves retention time of stored data. Specifically, the resistance of memory cells may change over time, thereby affecting reliability or accuracy of the memory device.

Accordingly, it is desirable to provide a memory device and an operating method, which effectively improves retention time of data.

SUMMARY

The present disclosure relates to a memory device and a method for operating the same.

According to an embodiment of the present disclosure, a memory device is provided. The memory device includes a plurality of resistive memory cells and a control circuitry electrically connected to the plurality of resistive memory cells. The control circuitry provides operation modes to operate the plurality of resistive memory cells. The operation modes include a first program operation and a refresh operation. The first program operation includes applying a first program bias voltage to a selected resistive memory cell of the plurality of resistive memory cells to establish a low-resistance state in the selected resistive memory cell. The first program operation establishes a first threshold voltage in the memory device. The refresh operation includes applying a refresh bias voltage to the selected resistive memory cell to refresh the selected resistive memory cell. An absolute value of the refresh bias voltage is greater than the first threshold voltage.

According to an embodiment of the present disclosure, a method for operating a memory device is provided. The memory device includes a plurality of resistive memory cells. The method includes: applying a first program bias voltage to a selected resistive memory cell of the plurality of resistive memory cells to establish a low-resistance state in the selected resistive memory cell, wherein the step of applying the first program bias voltage establishes a first threshold voltage in the memory device; and applying a refresh bias voltage to the selected resistive memory cell to refresh the selected resistive memory cell, wherein an absolute value of the refresh bias voltage is greater than the first threshold voltage.

The above and other embodiments of the disclosure will become better understood with regard to the following detailed description of the non-limiting embodiment(s). The following description is made with reference to the accompanying drawings.

DETAILED DESCRIPTION

Figure 1:
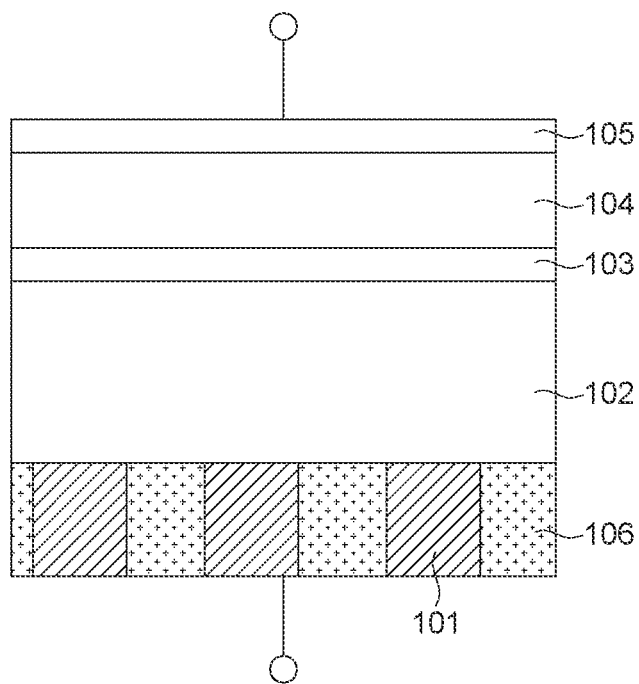
FIG. 1 illustrates a cross-section view of a memory device according to an embodiment of the present disclosure.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

Moreover, use of ordinal terms such as "first", "second", "third", etc., in the specification and claims to modify an element or a step does not by itself connote any priority, precedence, or order of one claim element or step over another, but are used merely as labels to distinguish one claim element or step having a certain name from another element or step having the same name (but for use of the ordinal term) to distinguish the claim elements or steps.

Use of term "electrically connected" in the specification and claims may mean that elements form an ohmic contact, a connection between elements allows an electric current flowing through the elements, or an element operationally relates to another element. The term "operationally relates to" may mean that an element is configured to drive another element without an electric current flowing therebetween. The present disclosure is not limited thereto. For instance, a bit line electrically connected to the memory cells may be understood as a bit line configured to drive the memory cells, that is, values of electric fields applied to the memory cells may be changed as a value of a voltage applied to the bit line electrically connected to the memory cells is changed. A word lines electrically connected to the memory cell may be understood a word line configured to drive the memory cell, that is, a value of electric field applied to the memory cell may be changed as a value of a voltage applied to the word line electrically connected to the memory cell is changed.

The embodiments of the present disclosure could be applied to many different two-terminal resistive memory devices. For example, embodiments of the present disclosure could be applied, but not limited to, conducting bridge resistive random-access memory device (ReRAM), transition metal oxide (TMO) resistive random-access memory device, phase change memory device, and so on.

FIG. 1 illustrates a cross-section view of the memory device 10 according to an embodiment of the present disclosure. The memory device 10 includes a first electrode 101, a memory layer 102, an adhesion layer 103, an ion-supplying layer 104, a second electrode 105 and an interlayer dielectric layer 106.

The first electrode 101 may be formed in the interlayer dielectric layer 106. The memory layer 102, the adhesion layer 103 and the ion-supplying layer 104 may be between the first electrode 101 and the second electrode 105. In this embodiment, the memory layer 102, the adhesion layer 103 and the ion-supplying layer 104 may be stacked in sequence on the first electrode 101; the memory layer 102 may directly contact the first electrode 101; the ion-supplying layer 104 may directly contact the second electrode 105; the adhesion layer 103 may be between the memory layer 102 and the ion-supplying layer 104. The second electrode 105 and the memory layer 102 may be on opposite sides of the ion-supplying layer 104.

The first electrode 101 and the second 105 may be used to conduct current. The first electrode 101 and the second 105 may include conductive materials. The ion-supplying layer 104 may be functioned as an ion source. The ion-supplying layer 104 may provide metal ions which can form a conducting bridge (or a conducting filament) in the memory device 10. The ion-supplying layer 104 may provide metal ions with high mobility, such as copper ions, silver ions or zinc ions. The ion-supplying layer 104 may include copper, silver or zinc. The adhesion layer 103 may be used to improve adhesion between the memory layer 102 and the ion-supplying layer 104. The adhesion layer 103 may allow ions from the ion-supplying layer 104 to pass through. The adhesion layer 103 may include metal, such as titanium (Ti). Ions from the ion-supplying layer 104 may gather to form a conducting bridge in the memory layer 102. The memory layer 102 may include a tellurium-based (Te-based) material, such as ZnTe. The interlayer dielectric layer 106 may include a dielectric material.

Figure 2:
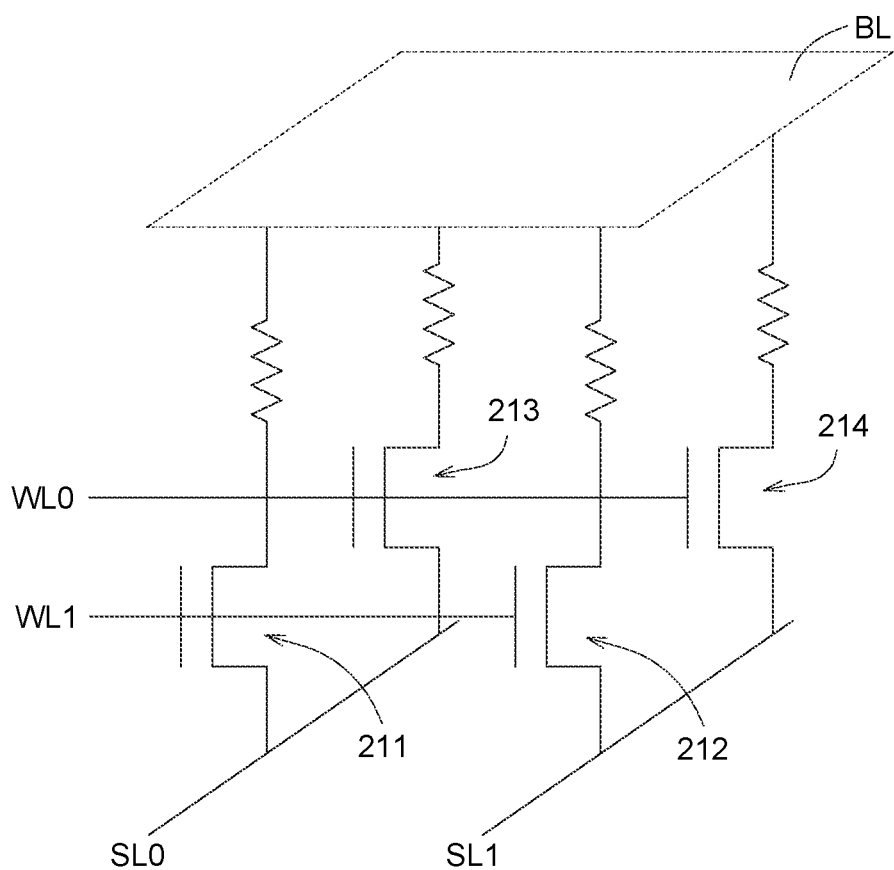
FIG. 2 illustrates an equivalent circuit diagram of a memory device according to an embodiment of the present disclosure.

FIG. 2 illustrates an equivalent circuit diagram of the memory device 10 according to an embodiment of the present disclosure. Referring to FIGS. 1-2, the memory device 10 may further include a plurality of resistive memory cells 211-214, word lines WL0, WL1, a bit line layer BL and source lines SL0, SL1 electrically connected to resistive memory cells 211-214, and a control circuitry (not shown). The resistive memory cells 211-214 may be defined in the memory layer 102 (as shown in FIG. 1). The bit line layer BL may include one or more bit lines. It should be noted that four resistive memory cells 211-214, two word lines WL0, WL1 and two source lines SL0, SL1 are shown in FIG. 2 for convenience of discussion; however, the present disclosure is not limited thereto, the memory device can include more resistive memory cells, more word lines and more source lines. The control circuitry may be electrically connected to the resistive memory cells 211-214 through word lines WL0, WL1, bit line layer BL and source lines SL0, SL1. The control circuitry may provide operation modes to operate the resistive memory cells 211-214. The operation modes include a first program operation and a second program operation. During the program operation, the control circuitry may apply a proper bias voltage to the resistive memory cell 211-214 through the word line WL0, WL1, the bit line layer BL and the source line SL0, SL1, and the resistive memory cell 211-214 is programmed to one of resistance states. Each resistance state corresponds to a data state. The present disclosure is described by taking a resistive memory cell 211-214 with two resistance states as an example; however, the present disclosure can be applied to a memory device with more resistance states.

Figure 3A:
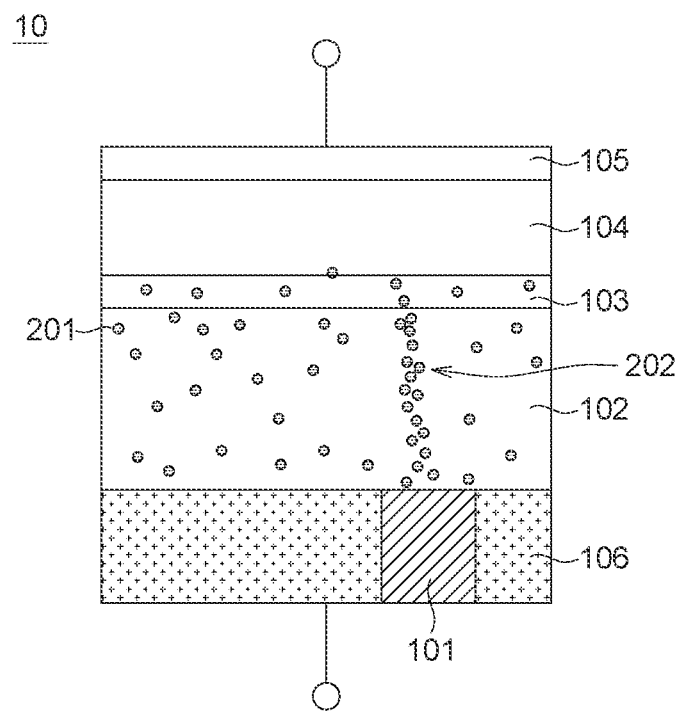
FIG. 3A illustrates a cross-section view of a memory device in a low-resistance state according to an embodiment of the present disclosure.

When the memory device shown in FIGS. 1-2 is in the first program operation, one of the resistive memory cells 211-214 is selected for programming, and the other resistive memory cells can be understood as unselected resistive memory cells. As an example, the following will take the resistive memory cell 211 as the selected resistive memory cell and take the resistive memory cells 212-214 as the unselected resistive memory cells. The present disclosure is not limited thereto. The first program operation includes applying a first program bias voltage to the selected resistive memory cell 211 to establish a low-resistance state in the selected resistive memory cell 211 through the word line WL1, the bit line layer BL and the source line SL0 electrically connected to the selected resistive memory cell 211. The first program bias voltage may refer to an electric potential difference between the first electrode 101 and the second electrode 105 of the memory device 10. The first program bias voltage has a first polarity. As shown in FIG. 3A, in the first program operation, applying a first program bias voltage to the selected resistive memory cell 211 can drive ions 201 provided by the ion-supplying layer 104 to the memory layer 102, and at least a portion of the ions 201 gathers in the memory layer 102 to form a conducting bridge 202 extending through the memory layer 102. In this case, the selected resistive memory cell 211 is in the low-resistance state.

Figure 3B:
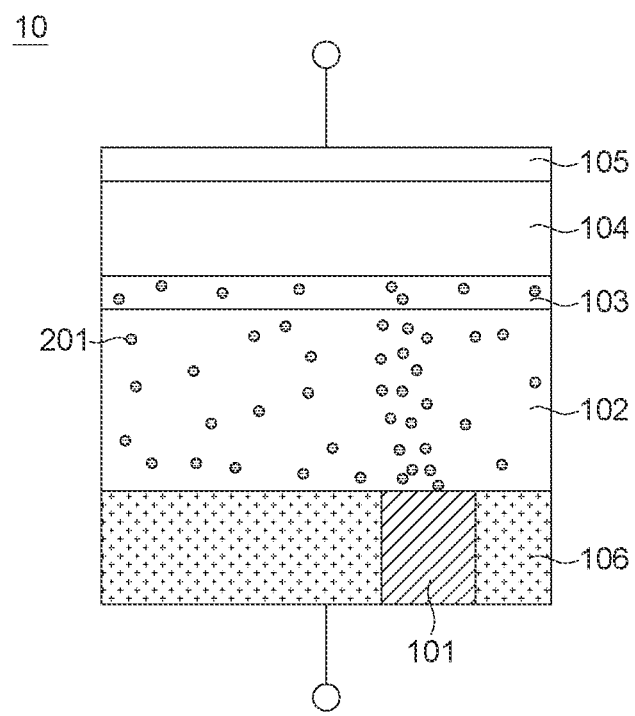
FIG. 3B illustrates a cross-section view of a memory device in a low-resistance state according to an embodiment of the present disclosure.

When the memory device shown in FIGS. 1-2 is in the second program operation, one of the resistive memory cells is selected for programming, and the other resistive memory cells can be understood as unselected memory cells. As an example, the following will take the resistive memory cell 211 as the selected resistive memory cell and take the resistive memory cells 212-214 as the unselected resistive memory cells. The present disclosure is not limited thereto. The second program operation includes applying a second program bias voltage to the selected resistive memory cell 211 to establish a high-resistance state in the selected resistive memory cell 211 through the word line WL1, the bit line layer BL and the source line SL0 electrically connected to the selected resistive memory cell 211. The second program bias voltage may refer to an electric potential difference between the first electrode 101 and the second electrode 105 of the memory device 10. The second program bias voltage has a second polarity. As shown in FIG. 3B, in the second program operation, applying a second program bias voltage to the selected resistive memory cell 211 can drive ions 201 of the conducting bridge 202 to move toward the ion-supplying layer 104, so that the conducting bridge 202 between the first electrode 101 and the second electrode 105 is destroyed. For example, the conducting bridge 202 may be broken in the second program operation. In this case, the selected resistive memory cell 211 is in the high-resistance state. The low-resistance state and the high-resistance state correspond to different data states. In an embodiment, the resistive memory cells 211-214 can be switched between different resistance states by applying different program bias voltages. An operation for switching the resistive memory cells 211-214 in a low-resistance state to a high-resistance state can be understood as a RESET operation. An operation for switching the resistive memory cells 211-214 in a high-resistance state to a low-resistance state can be understood as a SET operation.

The first polarity of the first program bias voltage may be different from the second polarity of the second program bias voltage. In an embodiment, the first program bias voltage is a forward bias, and the second program bias voltage is a reverse bias. The first program operation induces a first program current passing through the selected resistive memory cell. The second program operation induces a second program current passing through the selected resistive memory cell. The first program current may be different from the second program current. The first program operation establishes a first threshold voltage in the selected resistive memory cell of the memory device 10. The second program operation establishes a second threshold voltage in the selected resistive memory cell of the memory device 10. The first threshold voltage is different from the second threshold voltage. In an embodiment, the second threshold voltage is greater than the first threshold voltage.

The operation modes provided by the control circuitry further includes a refresh operation. After performing a program operation such as a first program operation to a resistive memory cell 211-214, the conducting bridge 202 may be spontaneously disassembled, which changes the resistance state of the resistive memory cell 211-214 and affects the accuracy of the stored data. Accordingly, the refresh operation may be performed after the program operation, such as the first program operation, so as to prolong the retention time of the resistance state of the resistive memory cell 211-214. As an example, the following will take the resistive memory cell 211 as the selected resistive memory cell and take the resistive memory cells 212-214 as the unselected resistive memory cells. The present disclosure is not limited thereto. The refresh operation includes applying a refresh bias voltage to the selected resistive memory cell 211 to refresh the selected resistive memory cell 211 through the word line WL1, the bit line layer BL and the source line SL0 electrically connected to the selected resistive memory cell 211. The refresh bias voltage may refer to an electric potential difference between the first electrode 101 and the second electrode 105 of the memory device 10. The refresh bias voltage has a first polarity. An absolute value of the refresh bias voltage is different from an absolute value of the first program bias voltage. In an embodiment, the refresh operation does not include applying the first program bias voltage to the selected resistive memory cell 211.

When the refresh operation is performed after the first program operation (i.e. the refresh bias voltage is applied to the selected resistive memory cell 211 in the low-resistance state), the refresh operation induces a first refresh current passing through the selected resistive memory cell 211, which improves the stability of the conducting bridge, reduce or inhibit the spontaneous disassembly of the conducting bridge, and prolong the retention time of the low-resistance state. The first refresh current may be greater than one-half of the first program current. In an embodiment, the refresh operation includes applying the refresh bias voltage multiple times when the conducting bridge of the selected resistive memory cell 211 exists. For example, the refresh operation may include applying the refresh bias voltage periodically when the conducting bridge of the selected resistive memory cell 211 exists. In an embodiment, the retention time of the low-resistance state can be increased with the number of times the refresh bias voltage is applied.

When the refresh operation is performed after the second program operation (i.e. the refresh bias voltage is applied to the selected resistive memory cell 211 in the high-resistance state), the refresh operation induces a second refresh current passing through the selected resistive memory cell 211. The high-resistance state is less affected by the second refresh current. The first refresh current may be larger than the second refresh current.

The operation modes provided by the control circuitry further includes a read operation. When the memory device shown in FIGS. 1-2 is in the read operation, one of the resistive memory cells is selected for reading, and the other resistive memory cells can be understood as unselected resistive memory cells. As an example, the following will take the resistive memory cell 211 as the selected resistive memory cell and take the resistive memory cells 212-214 as the unselected resistive memory cells. The present disclosure is not limited thereto. The read operation includes applying a read bias voltage to the selected resistive memory cell 211 through the word line WL1, the bit line layer BL and the source line SL0 electrically connected to the selected resistive memory cell 211, and read data state stored in the selected resistive memory cell 211 according to induced read current. The read bias voltage may refer to an electric potential difference between the first electrode 101 and the second electrode 105 of the memory device 10. The read bias voltage has a first polarity. An absolute value of the read bias voltage may be equal to the absolute value of the refresh bias voltage.

TABLE 1

| | | first program operation | second program operation | refresh operation | read operation |
|---|---|---|---|---|---|
| bit line layer | | 2.5 V | 0 V | 0.8 V | 0.8 V |
| source line | selected | 0 V | 1.6 V | 0 V | 0 V |
| | unselected | 2.5 V | 0 V | 0.8 V | 0.8 V |
| word line | selected | 1.8 V | 2.2 V | 5.0 V | 5.0 V |
| | unselected | 0 V | 0 V | 0 V | 0 V |

In an embodiment, the voltage values applied to the bit line, the source line and the word line in different operation modes are shown in above TABLE 1. The first program operation may include: applying a bit line voltage, such as 2.5 V, to a bit line layer electrically connected to the selected resistive memory cell; applying a source line voltage, such as 0 V, to a source line electrically connected to the selected resistive memory cell; applying a word line voltage, such as 1.8 V, to a word line electrically connected to the selected resistive memory cell. The second program operation may include: applying a bit line voltage, such as 0 V, to a bit line layer electrically connected to the selected resistive memory cell; applying a source line voltage, such as 1.6 V, to a source line electrically connected to the selected resistive memory cell; applying a word line voltage, such as 2.2 V, to a word line electrically connected to the selected resistive memory cell. The refresh operation may include: applying a bit line voltage, such as 0.8 V, to a bit line layer electrically connected to the selected resistive memory cell; applying a source line voltage, such as 0 V, to a source line electrically connected to the selected resistive memory cell; applying a word line voltage, such as 5 V, to a word line electrically connected to the selected resistive memory cell. The read operation may include: applying a bit line voltage, such as 0.8 V, to a bit line layer electrically connected to the selected resistive memory cell; applying a source line voltage, such as 0 V, to a source line electrically connected to the selected resistive memory cell; applying a word line voltage, such as 5.0 V, to a word line electrically connected to the selected resistive memory cell.

According to embodiments of the present disclosure, the memory device can be operated in various operation modes. The operation modes includes a first program operation and a refresh operation; the first program operation includes applying a first program bias voltage to establish a low-resistance state in the memory device, and the refresh operation includes applying a refresh bias voltage to refresh the memory device; an absolute value of the refresh bias voltage is greater than the first threshold voltage of the memory device in the first program operation. With such arrangement, the stability of the conducting bridge can be improved, the spontaneous disassembly of the conducting bridge can be reduced or inhibited and the retention time of the resistance state (or may be understood as data state) of the memory device can be prolonged. Accordingly, the reliability or accuracy of the memory device can be improved. In addition, the refresh operation includes applying the refresh bias voltage one or multiple times, to prolong the retention time of the resistance state and the refresh operation may not include applying the first program operation. With such arrangement, the voltage switching times of the bit line and/or source line can be reduced, power consumption can be reduced the operation of the memory device can be simplified, and the retention time of the data state can be prolonged effectively and simply. The refresh operation of the present disclosure is a self-defined refresh operation.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a memory device, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
    a plurality of resistive memory cells; and
    a control circuitry electrically connected to the plurality of resistive memory cells and providing operation modes to operate the plurality of resistive memory cells, wherein the operation modes comprise:
    a first program operation, wherein the first program operation comprises applying a first program bias voltage to a selected resistive memory cell of the plurality of resistive memory cells to establish a low-resistance state in the selected resistive memory cell, wherein the first program operation establishes a first threshold voltage in the memory device; and
    a refresh operation, wherein the refresh operation comprises applying a refresh bias voltage to the selected resistive memory cell to refresh the selected resistive memory cell, wherein an absolute value of the refresh bias voltage is greater than the first threshold voltage.

2. The memory device according to claim 1, wherein the operation modes further comprises a second program operation, the second program operation comprises applying a second program bias voltage to the selected resistive memory cell to establish a high-resistance state in the selected resistive memory cell, the second program operation establishes a second threshold voltage in the memory device, the second threshold voltage is greater than the first threshold voltage.

3. The memory device according to claim 2, wherein the absolute value of the refresh bias voltage is less than the second threshold voltage.

4. The memory device according to claim 1, wherein the first program operation induces a program current passing through the selected resistive memory cell, performing the refresh operation to the selected resistive memory cell in the low-resistance state induces a refresh current passing through the selected resistive memory cell, the refresh current is greater than one-half of the program current.

5. The memory device according to claim 1, wherein the operation modes further comprises a read operation, the read operation comprises applying a read bias voltage to the selected resistive memory cell to read the selected resistive memory cell, an absolute value of the read bias voltage is equal to the absolute value of the refresh bias voltage.

6. The memory device according to claim 1, wherein the refresh operation comprises applying the refresh bias voltage multiple times.

7. The memory device according to claim 1, wherein the refresh operation is performed after the first program operation.

8. The memory device according to claim 1, wherein the refresh operation does not comprise applying the first program bias voltage to the selected resistive memory cell.

9. The memory device according to claim 1, further comprising:
    a first electrode;
    a second electrode;
    a memory layer between the first electrode and the second electrode; and
    an ion-supplying layer between the first electrode and the second electrode, wherein the second electrode and the memory layer are on opposite sides of the ion-supplying layer,
    wherein the plurality of resistive memory cells are in the memory layer.

10. The memory device according to claim 9, wherein the ion-supplying layer comprises copper, silver or zinc.

11. The memory device according to claim 9, wherein the memory layer comprises a Te-based material.

12. The memory device according to claim 9, further comprising an adhesion layer between the memory layer and the ion-supplying layer, the adhesion layer comprises metal.

13. The memory device according to claim 9, wherein the first program operation induces a conducting bridge formed between the first electrode and the second electrode.

14. A method for operating a memory device, the memory device comprising a plurality of resistive memory cells, the method comprising:
    applying a first program bias voltage to a selected resistive memory cell of the plurality of resistive memory cells to establish a low-resistance state in the selected resistive memory cell, wherein the step of applying the first program bias voltage establishes a first threshold voltage in the memory device; and
    applying a refresh bias voltage to the selected resistive memory cell to refresh the selected resistive memory cell, wherein an absolute value of the refresh bias voltage is greater than the first threshold voltage.

15. The method according to claim 14, further comprising:
   applying a second program bias voltage to the selected resistive memory cell of the plurality of resistive memory cells to establish a high-resistance state in the selected resistive memory cell, wherein the step of applying the second program bias voltage establishes a second threshold voltage in the memory device, the second threshold voltage is greater than the first threshold voltage.

16. The method according to claim 15, wherein the absolute value of the refresh bias voltage is less than the second threshold voltage.

17. The method according to claim 14, wherein the step of applying the refresh bias voltage is performed after the step of applying the first program bias voltage.

18. The method according to claim 17, wherein the step of applying the first program bias voltage induces a program current passing through the selected resistive memory cell, the step of applying the refresh bias voltage induces a refresh current passing through the selected resistive memory cell, the refresh current is greater than one-half of the program current.

19. The method according to claim 14, further comprising applying a read bias voltage to the selected resistive memory cell to read the selected resistive memory cell, the read bias voltage is equal to the refresh bias voltage.

20. The method according to claim 14, wherein the step of applying the refresh bias voltage comprises applying the refresh bias voltage multiple times.

* * * * *